(12) United States Patent
Matsuzawa

(10) Patent No.: US 7,411,236 B2
(45) Date of Patent: Aug. 12, 2008

(54) SEMICONDUCTOR STORAGE DEVICE

(75) Inventor: Kazuya Matsuzawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 11/486,104

(22) Filed: Jul. 14, 2006

(65) Prior Publication Data

US 2007/0133337 A1    Jun. 14, 2007

(30) Foreign Application Priority Data

Jul. 15, 2005    (JP)    ............................. 2005/207099

(51) Int. Cl.
*H01L 27/108*    (2006.01)

(52) U.S. Cl. .................. 257/296; 257/288; 257/369; 257/392

(58) Field of Classification Search ................. 257/296, 257/288, 369, 392
See application file for complete search history.

(56) References Cited

OTHER PUBLICATIONS

STARC News No. 23, Jan. 15, 2005, Semiconductor Technology Academic Research Center (STARC), URL:http://www.starc.or.jp, with English-language translation of portions of pages 10-11.

*Primary Examiner*—Long Pham
(74) *Attorney, Agent, or Firm*—Finnegan, Henderson, Farabow, Garrett & Dunner, L.L.P.

(57) ABSTRACT

A semiconductor storage device has a first transistor of first conductive type which control data writing, a second transistor of second conductive type which controls data read-out, a third transistor which amplifies a current corresponding to data to be read out, a first semiconductor layer which is disposed in a predetermined direction, in which a gate of the first transistor is formed, a second semiconductor layer which is disposed separately from the first semiconductor layer in the predetermined direction, in which source and drain of the second transistor and source and drain of the third transistor are formed, a write transistor forming region which is disposed in a direction intersecting the first and second semiconductor layers, in which source and drain of the first transistor, a gate of the third transistor and an electric charge storing region storing electric charge in accordance with data to be written are formed, and a read-out transistor gate region which is disposed in a direction intersecting the first and second semiconductor layers, in which a gate of the second transistor is formed.

18 Claims, 19 Drawing Sheets

BB' CROSS SECTION

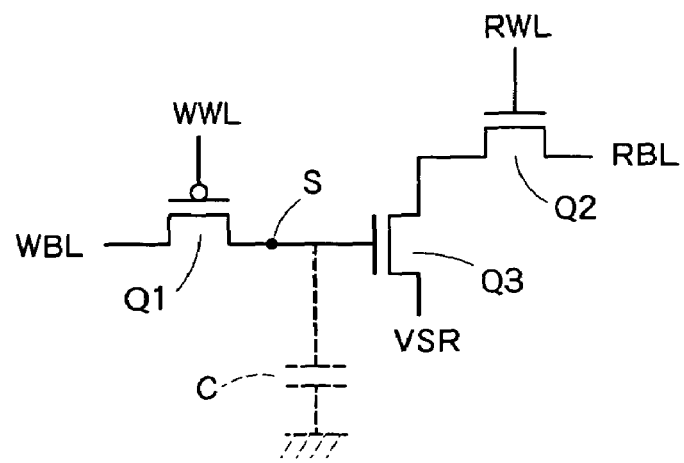
F I G. 1
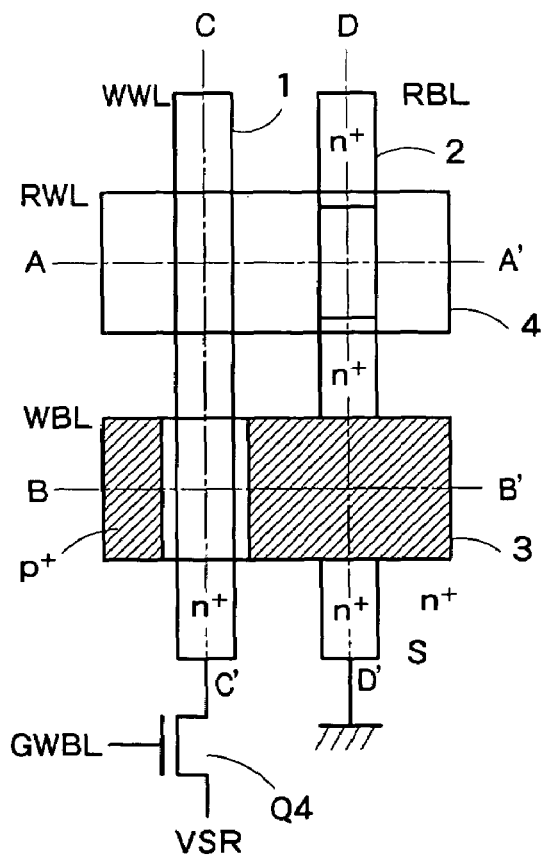
F I G. 2

AA' CROSS SECTION

BB' CROSS SECTION

CC' CROSS SECTION

DD' CROSS SECTION

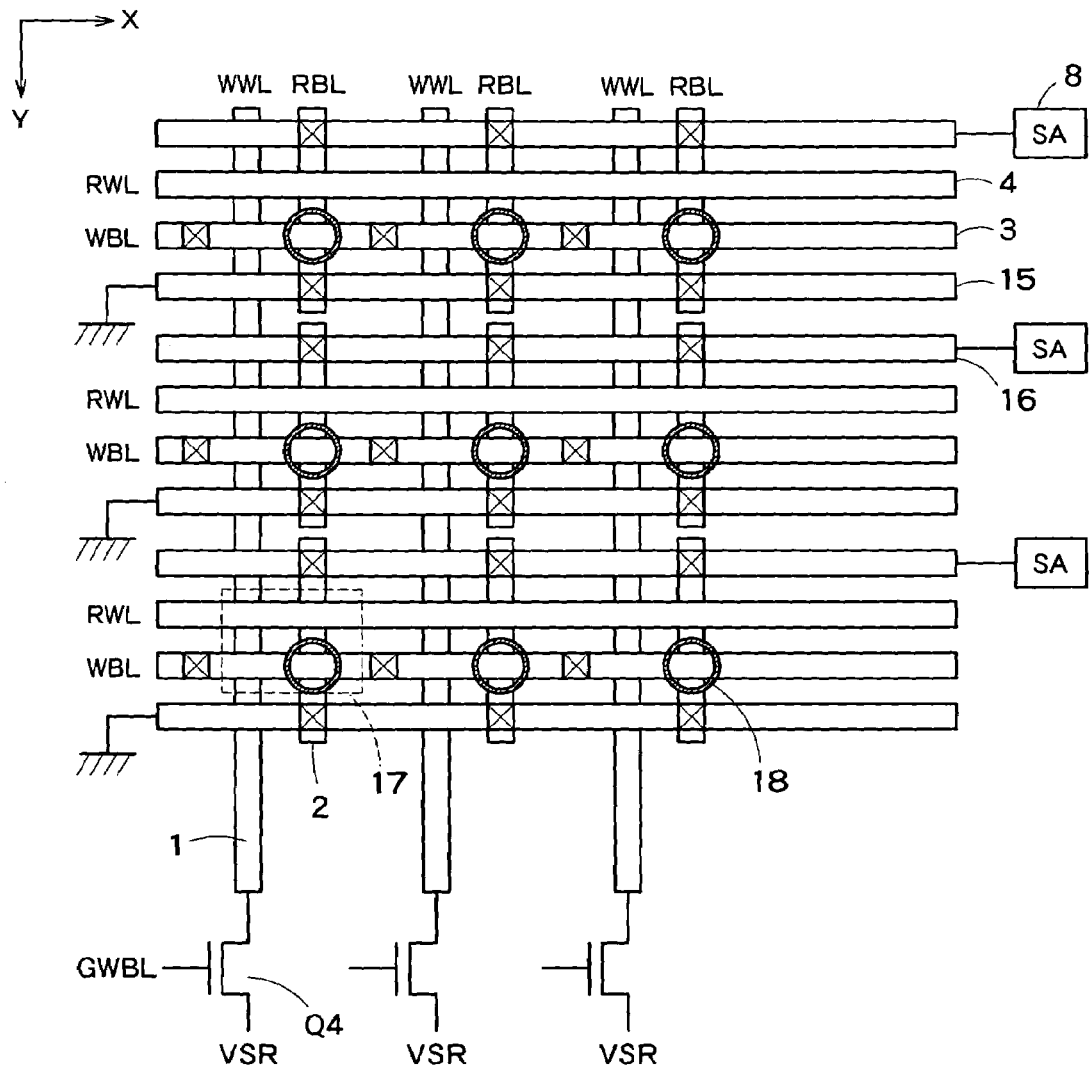
F I G. 5

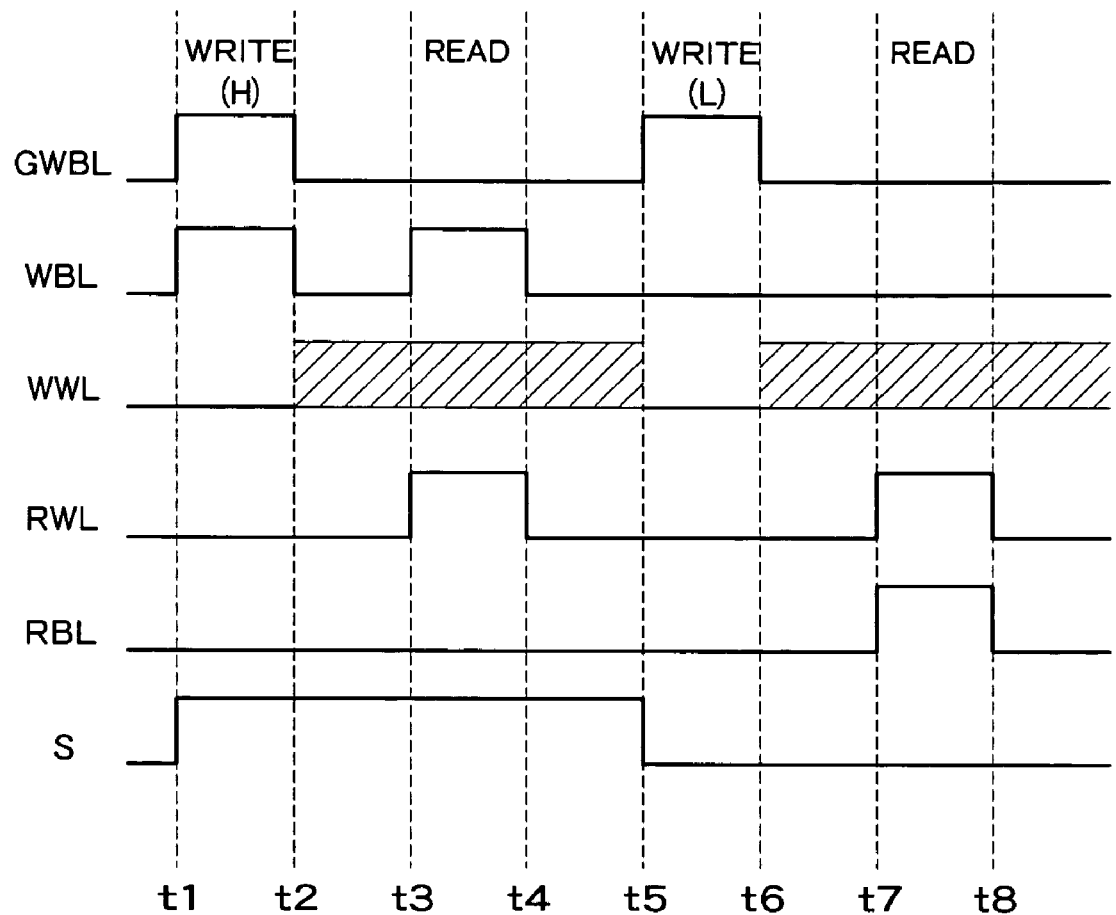
F I G. 6

AA' CROSS SECTION

BB' CROSS SECTION

CC' CROSS SECTION

DD' CROSS SECTION

AA' CROSS SECTION

BB' CROSS SECTION

CC' CROSS SECTION

DD' CROSS SECTION

AA' CROSS SECTION

BB' CROSS SECTION

CC' CROSS SECTION

DD' CROSS SECTION

AA' CROSS SECTION

BB' CROSS SECTION

CC' CROSS SECTION

DD' CROSS SECTION

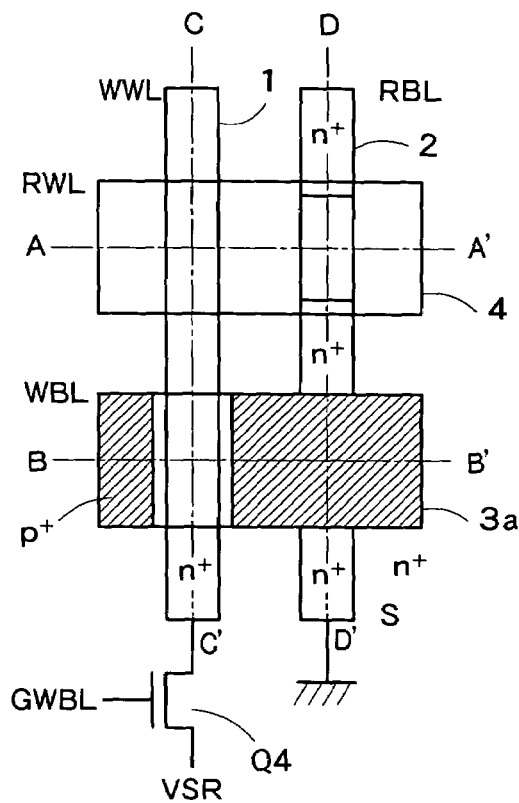
F I G. 11
F I G. 12A
AA' CROSS SECTION
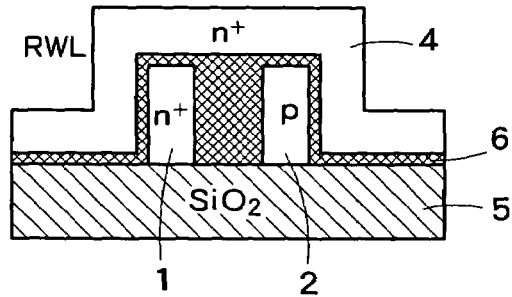
F I G. 12B
BB' CROSS SECTION
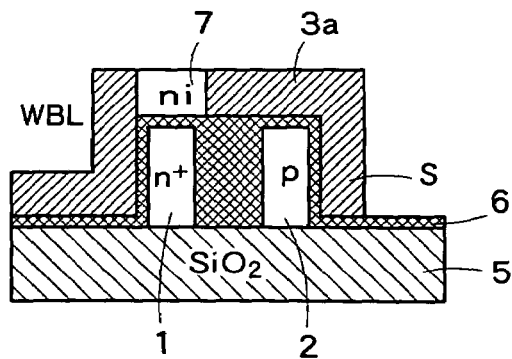

F I G. 13A
AA' CROSS SECTION
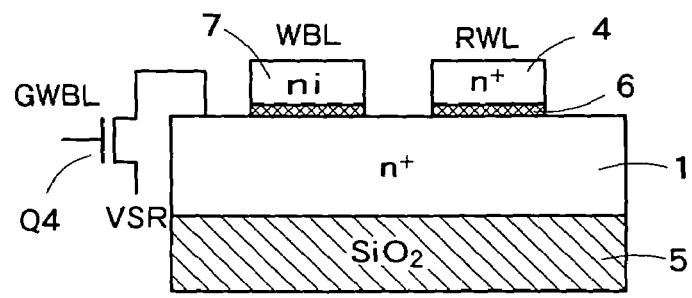
F I G. 13B
BB' CROSS SECTION
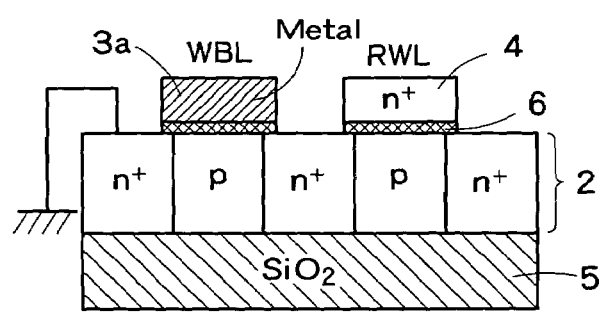

AA' CROSS SECTION

BB' CROSS SECTION

CC' CROSS SECTION

DD' CROSS SECTION

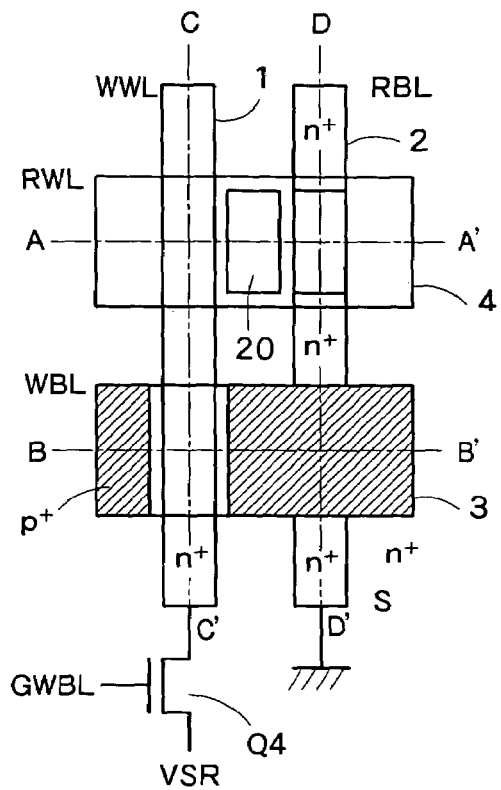
F I G. 15
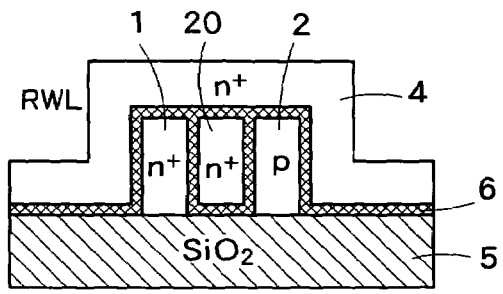
F I G. 16A
AA' CROSS SECTION
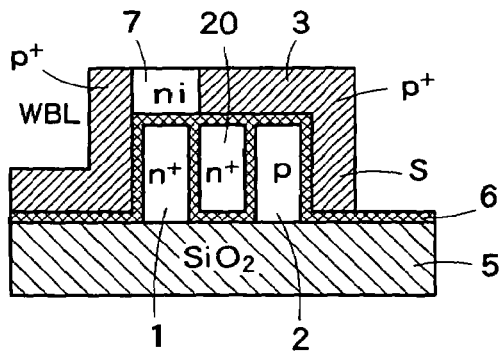
F I G. 16B
BB' CROSS SECTION

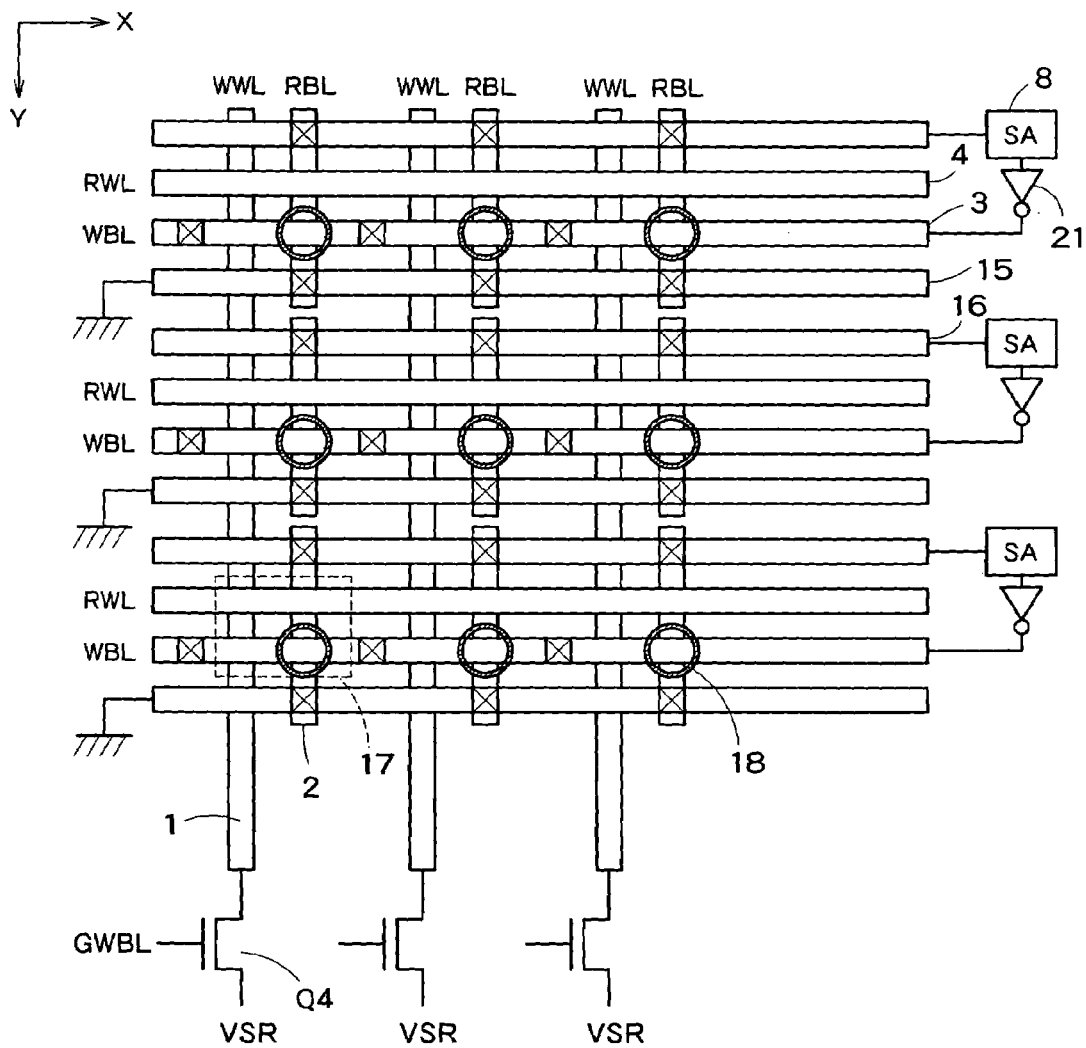
F I G. 17

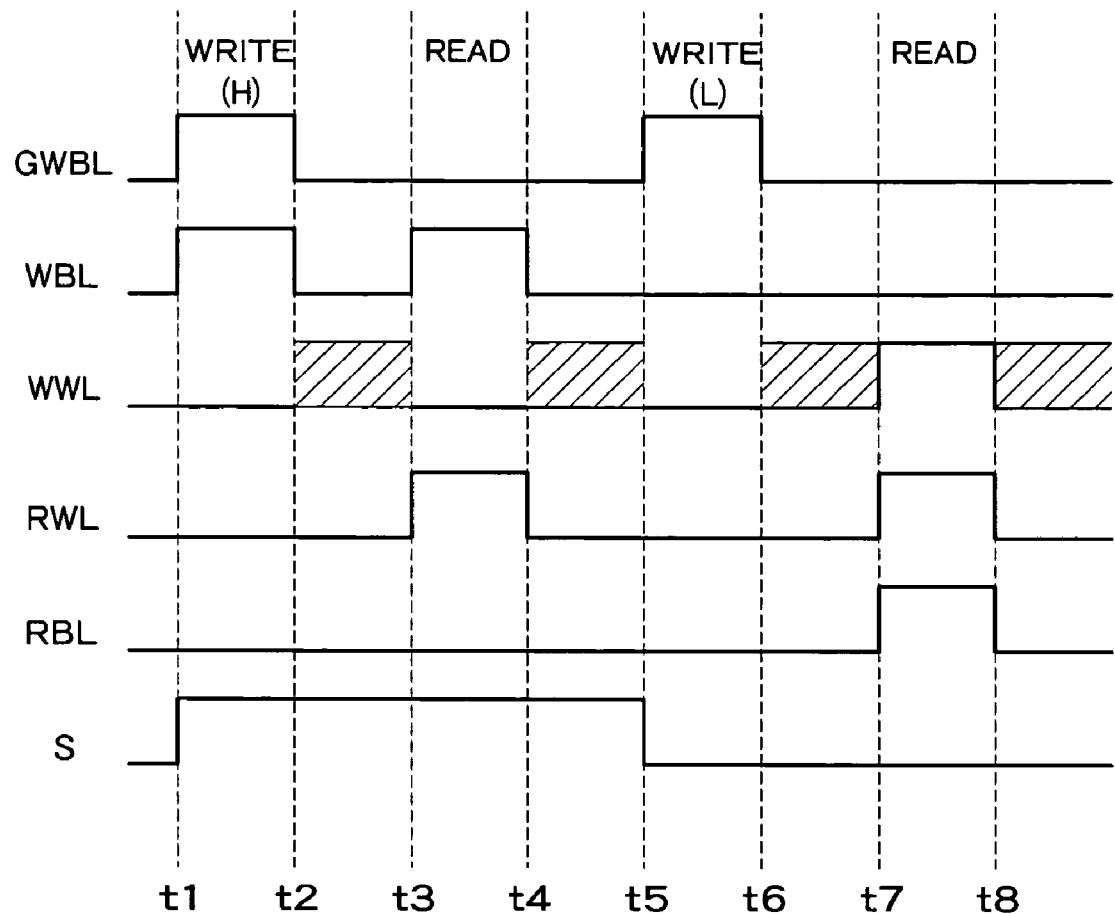
F I G. 18

AA' CROSS SECTION

BB' CROSS SECTION

CC' CROSS SECTION

DD' CROSS SECTION

F I G. 20A
AA' CROSS SECTION
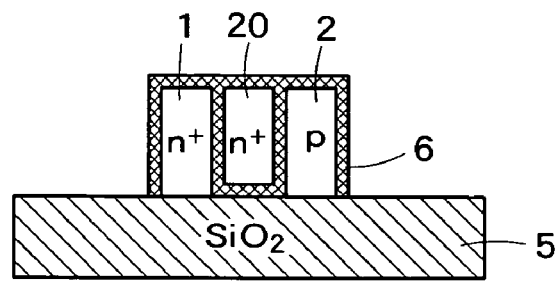
F I G. 20B
BB' CROSS SECTION
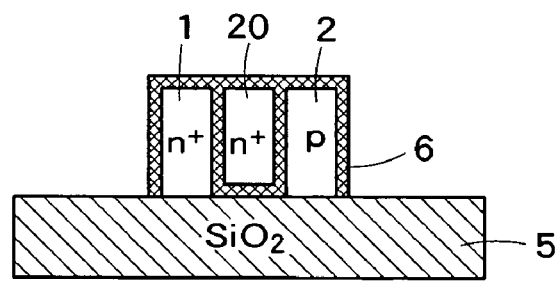
F I G. 20C
CC' CROSS SECTION
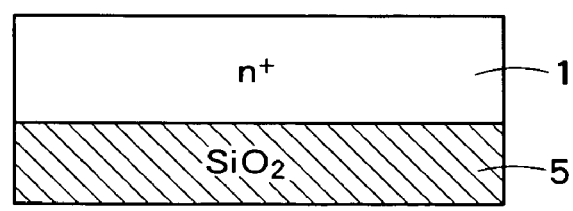
F I G. 20D
DD' CROSS SECTION
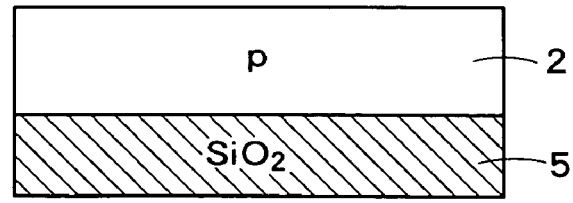

AA' CROSS SECTION

BB' CROSS SECTION

CC' CROSS SECTION

DD' CROSS SECTION

AA' CROSS SECTION

BB' CROSS SECTION

CC' CROSS SECTION

DD' CROSS SECTION

SEMICONDUCTOR STORAGE DEVICE

CROSS REFERENCE TO RELATED APPLICATIONS

This application is based upon and claims the benefit of priority from the prior Japanese Patent Application No. 2005-207099, filed on Jul. 15, 2005, the entire contents of which are incorporated herein by reference.

BACKGROUND OF THE INVENTION

1. Field of the Invention

The present invention relates to a semiconductor storage device that it is possible to facilitate miniaturization and refresh operation.

2. Related Art

There are various types of semiconductor storage devices such as DRAM, SRAM and flash memory. Among these devices, SRAM is capable of performing the read/write operations at a high speed. However, SRAM has more complicated circuit configuration than DRAM and requires six transistors for storing 1 bit data. Therefore, SRAM is not suitable for storing a large volume of data.

On the other hand, DRAM can be configured by only one capacitor and one transistor, so that DRAM facilitates miniaturization and is suitable for storing a large volume of data. However, in the case where DRAM is highly integrated, the area of a capacitor is also reduced, so that the quantity of electric charges storable in the capacitor is reduced so as to make it difficult to correctly determine the logic level of data.

As a method for solving the above described problems, there has been proposed a gain cell referred to as Asymmetric Three-Transistor Cell (ATC) for amplifying and reading out a small quantity of electric charges stored in minute capacitors (see STARC news issued on Jan. 15, 2005, Semiconductor Technology Academic Research Center (STARC), URL: http://www.starc.or.jp).

In the gain cell disclosed in the above reference, PMOS transistors are used as the write transistor and NMOS transistors are used for the read-out transistor and the transistor for information amplification, respectively, so as to make the direction of gate leak paths to a storage node opposite to each other. Thereby, the final equilibrium level of potential in the memory is made to be an intermediate level between "1" and "0", so that the data holding characteristic is improved against data destruction caused by the leak current without providing large capacitors, and electric power required for holding data can also be reduced.

SUMMARY OF THE INVENTION

An object of the present invention is to provide a semiconductor storage device having a simple configuration and capable of stably storing data.

According to one embodiment of the present invention, a semiconductor storage device, comprising:

a first transistor of first conductive type which control data writing;

a second transistor of second conductive type which controls data read-out;

a third transistor which amplifies a current corresponding to data to be read out;

a first semiconductor layer which is disposed in a predetermined direction, in which a gate of the first transistor is formed;

a second semiconductor layer which is disposed separately from the first semiconductor layer in the predetermined direction, in which source and drain of the second transistor and source and drain of the third transistor are formed;

a write transistor forming region which is disposed in a direction intersecting the first and second semiconductor layers, in which source and drain of the first transistor, a gate of the third transistor and an electric charge storing region storing electric charge in accordance with data to be written are formed; and a read-out transistor gate region which is disposed in a direction intersecting the first and second semiconductor layers, in which a gate of the second transistor is formed.

BRIEF DESCRIPTION OF THE DRAWINGS

FIG. 1 is a circuit diagram showing a semiconductor storage device of a first embodiment according to the present invention.

FIG. 2 is a layout diagram of the semiconductor storage device shown in FIG. 1.

FIG. 5 is an entire layout diagram of the semiconductor storage device according to the first embodiment.

FIG. 6 is a timing chart of an operation of the semiconductor storage device according to the first embodiment.

FIG. 11 is a layout diagram for one cell of a semiconductor storage device of the second embodiment according to the present invention.

FIG. 12A is a cross-sectional view along the line A-A' in FIG. 11, and FIG. 12B is a cross-sectional view along the line B-B' in FIG. 11.

FIG. 13A is a cross-sectional view along the line C-C' in FIG. 11, and FIG. 13B is a cross-sectional view along the line D-D' in FIG. 11.

FIG. 15 is a layout diagram of a semiconductor storage device of the third embodiment according to the present invention.

FIG. 16A is a cross-sectional view along the line A-A' in FIG. 15, and FIG. 16B is a cross-sectional view along the line B-B' in FIG. 15.

FIG. 17 is an entire layout diagram showing the semiconductor storage device according to the third embodiment.

FIG. 18 is a timing chart of an operation of the semiconductor storage device according to the third embodiment.

FIGS. 20A-20D are process charts subsequent to FIG. 19.

DETAILED DESCRIPTION OF THE INVENTION

Figure 3A:
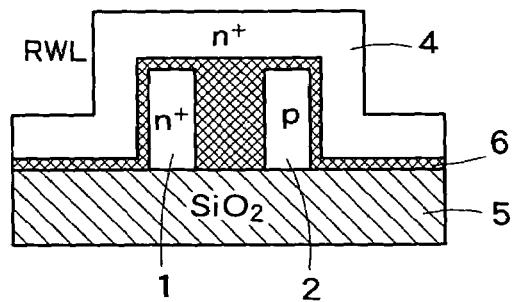
FIG. 3A is a cross-sectional view along the line A-A' in FIG. 2.

In the following, embodiments according to the present invention will be described with reference to the accompanying drawings.

First Embodiment

FIG. 1 is a circuit diagram showing a semiconductor storage device of a first embodiment according to the present invention, and showing a circuit configuration of Asymmetric Three-Transistor Cell (ATC).

The semiconductor storage device shown in FIG. 1 is provided with a PMOS transistor Q1 which performs write control of data, a NMOS transistor Q2 which performs read-out control of data, and a NMOS transistor Q3 which performs current amplification of read-out data.

The gate of the transistor Q1 is connected to a write word line WWL, the source of the transistor Q1 is connected to a write bit line WBL, and the drain of the transistor Q1 is connected to the gate of the transistor Q3. The gate of the transistor Q2 is connected to a read-out word line RWL, the source of the transistor Q2 is connected to a read-out bit line RBL, and the drain of the transistor Q2 is connected to the drain of the transistor Q3. The source of the transistor Q3 is set to a reference potential VSR (for example, ground potential).

A connection node S between the transistors Q1, Q3 is an electric charge storage node, and data is stored in the capacitance C of the connection node S.

In the following, an operation principle of the semiconductor storage device shown in FIG. 1 will be described. When data is written, the transistor Q1 is turned on, so that data supplied from the write bit line WBL is stored in the electric charge storage node S via the transistor Q1.

When data is read out, the transistor Q2 is turned on. Thereby, current corresponding to data stored in the electric charge storage node S flows through the transistor Q3, so that a potential corresponding to the current is read out to the read-out bit line RBL via the transistor Q2. For example, when "1" is stored in the electric charge storage node S, the inverted data "0" is read out to the read bit line RBL.

FIG. 2 is a layout diagram of the semiconductor storage device shown in FIG. 1. The semiconductor storage device shown in FIG. 2 includes first and second semiconductor layers 1, 2 arranged in the same direction so as to be separated from each other, a write transistor forming region 3 arranged in the direction intersecting the first and second semiconductor layers 1, 2, a read-out transistor gate region 4 arranged in the direction intersecting with the first and second semiconductor layers 1, 2, and a NMOS transistor Q4 switching whether or not to set one end of the first semiconductor layer 1 to a referential potential (for example, ground potential).

One end of the first semiconductor layer 1 is connected with the write word line WWL. In the second semiconductor layer 2, the source and drain of the transistors Q2, Q3 are formed. One end of write transistor forming region 3 is connected with the write bit line WBL, and the source and drain of the transistor Q1 and the electric charge storage area are formed in this region. The read-out transistor gate region 4 is used as the gate of the transistor Q2.

Figure 3B:
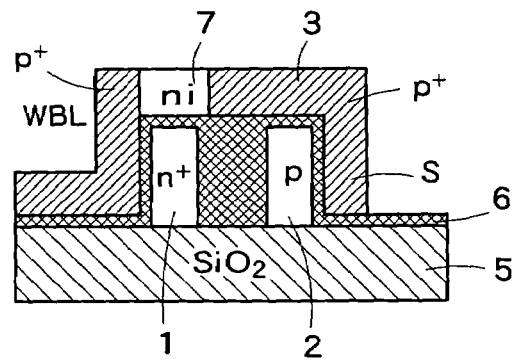
FIG. 3B is a cross-sectional view along the line B-B' in FIG. 2.

FIG. 3A is a cross-sectional view along the line A-A' in FIG. 2, and FIG. 3B is a cross-sectional view along the line B-B' in FIG. 2. In the cross-sectional view along the line A-A', the first semiconductor layer 1 and the second semiconductor layer 2 are arranged on a $SiO_2$ layer 5 so as to make an insulating layer 6 sandwiched between the semiconductor layers. The read-out transistor gate region 4 is arranged above the semiconductor layers via the insulating layer 6. The read-out transistor gate region 4 is for example $n^+$ layer.

In the cross-sectional view along the line B-B', the write transistor forming region 3 is arranged above the first semiconductor layer 1 and the second semiconductor layer 2 via the insulating layer 6. A part of the write transistor forming region 3, more specifically, above the first semiconductor layer 1, a channel region 7 is formed. Both sides of the channel region 7 in the write transistor forming region 3 are the source and drain regions of the transistor Q1. Since the transistor Q1 is PMOS, the channel region 7 in the write transistor forming region 3 is an intrinsic semiconductor area or an n region, and the source and drain regions are a $p^+$ region.

A part of the write transistor forming region 3 is used as the electric charge storage region S. An electric charge corresponding to one of write data is stored in this region. Therefore, the semiconductor storage device according to the present embodiment need not be separately provided with capacitor elements, so that the circuit area can be reduced.

Figure 4A:
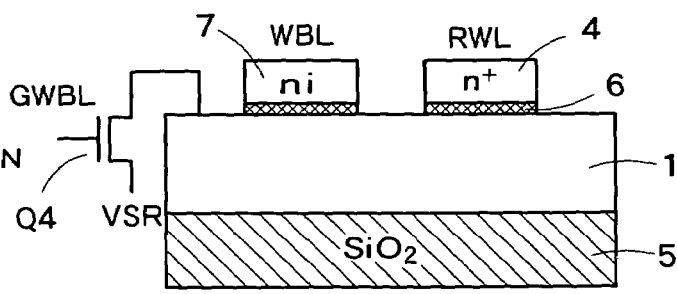
FIG. 4A is a cross-sectional view along the line C-C' in FIG. 2.
Figure 4B:
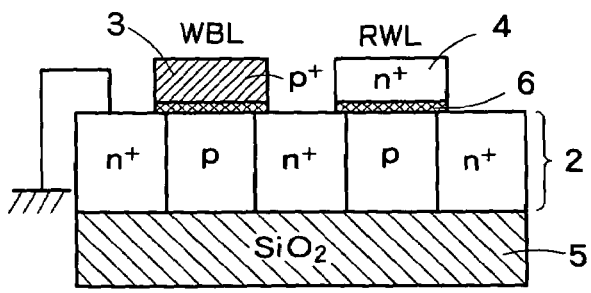
FIG. 4B is a cross-sectional view along the line D-D' in FIG. 2.
Figure 7A:
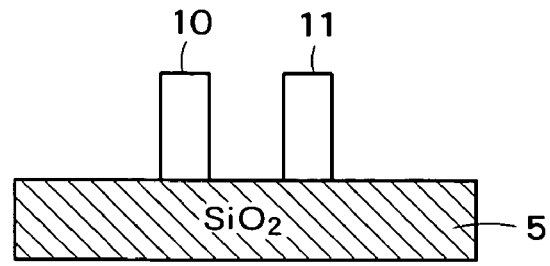
FIGS. 7A-7D are process charts showing a manufacturing process of the semiconductor storage device according to the present embodiment.
Figure 7B:
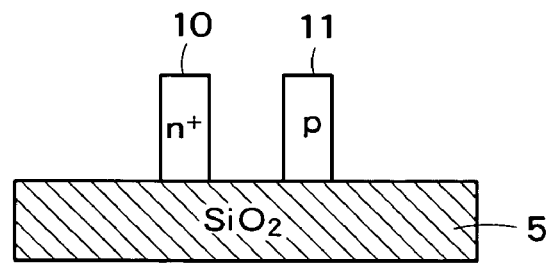
Figure 7C:
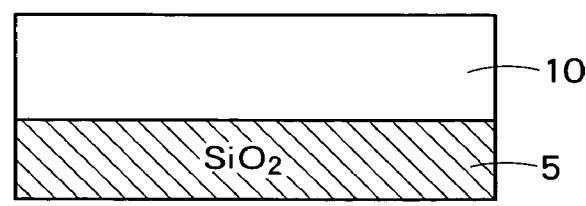
Figure 7D:
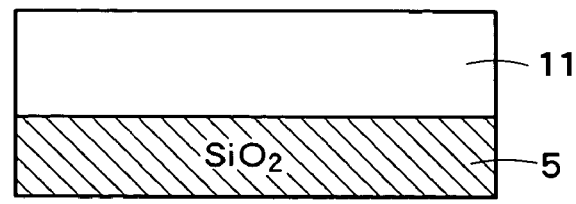
Figure 8A:
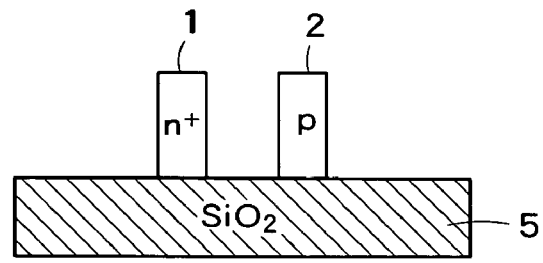
FIGS. 8A-8D are process charts subsequent to FIG. 7.
Figure 8B:
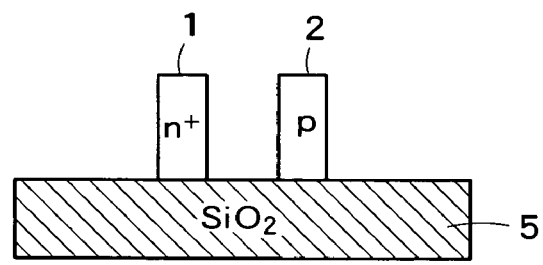
Figure 8C:
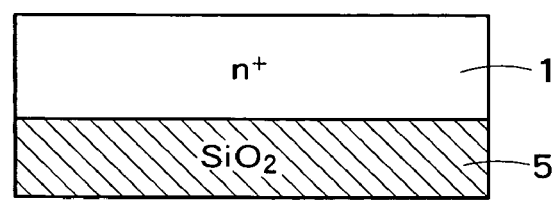
Figure 8D:
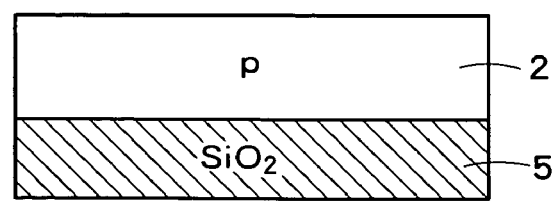
Figure 9A:
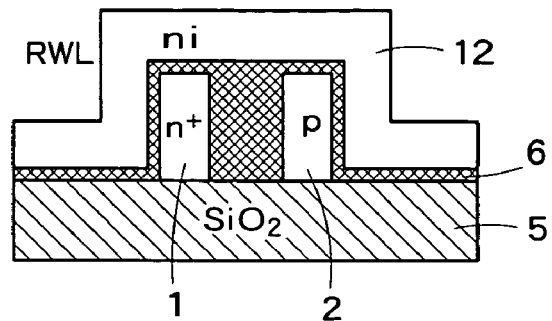
FIGS. 9A-9D are process charts subsequent to FIG. 8.
Figure 9B:
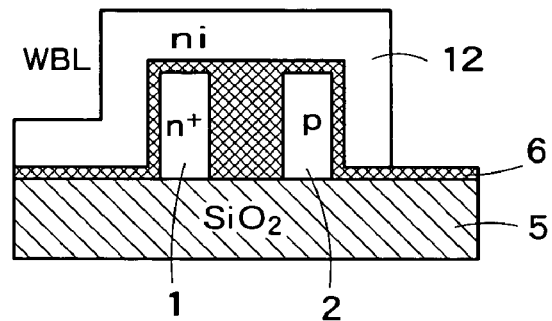
Figure 9C:
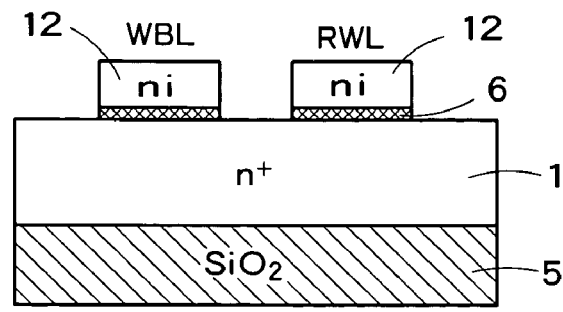
Figure 9D:
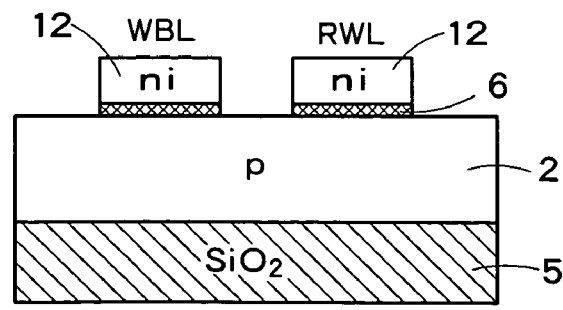
Figure 10A:
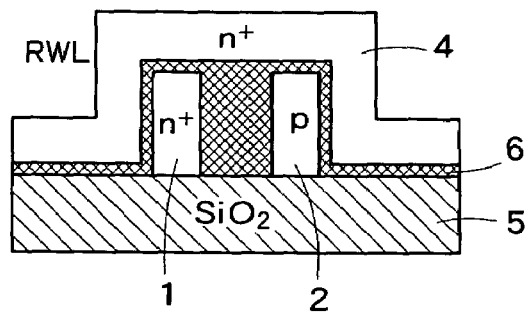
FIGS. 10A-10D are process charts subsequent to FIG. 9.
Figure 10B:
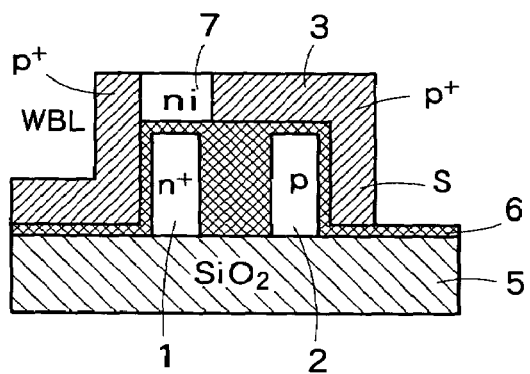
Figure 10C:
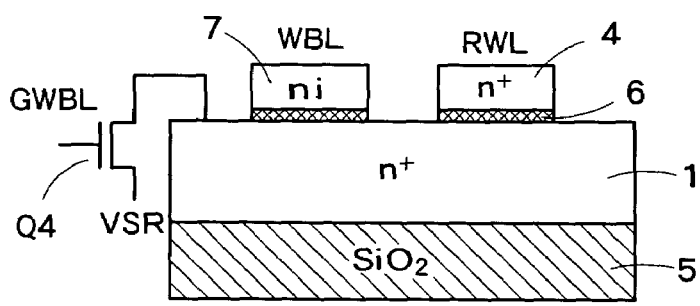
Figure 10D:
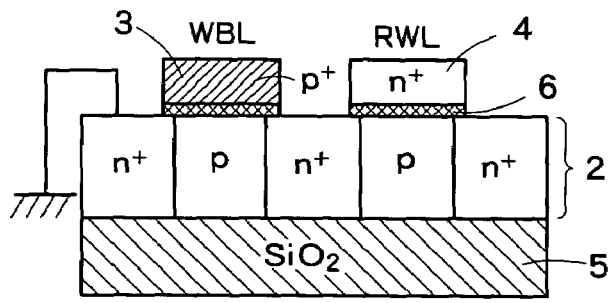
Figure 14A:
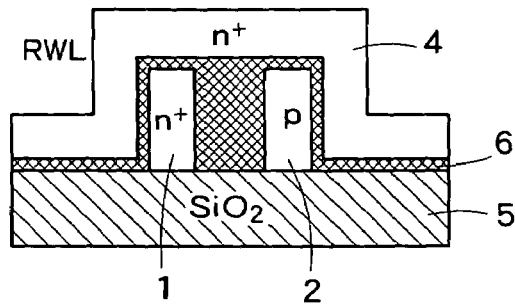
FIGS. 14A-14D are process charts explaining manufacturing processes according to second embodiment.
Figure 14B:
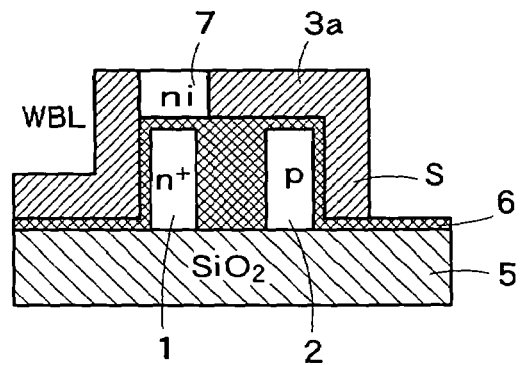
Figure 14C:
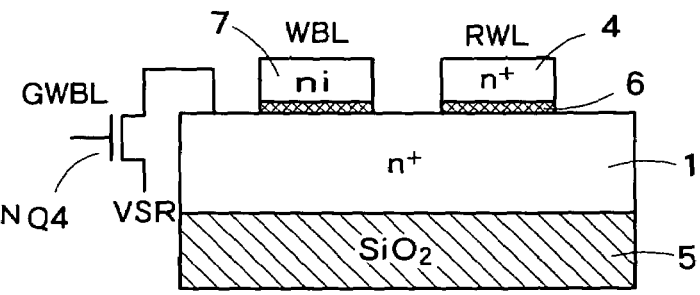
Figure 14D:
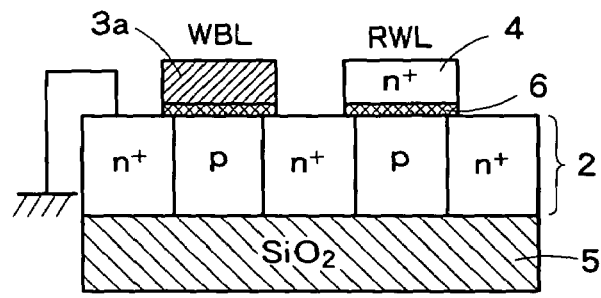
Figure 19A:
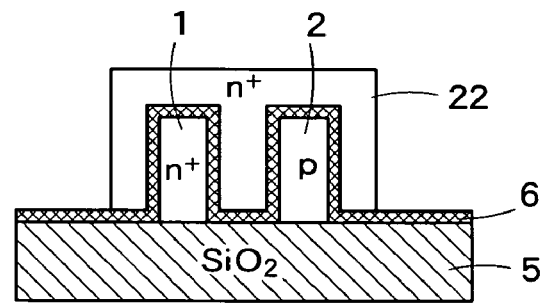
FIGS. 19A-19D are process charts explaining manufacturing processes according to third embodiment.
Figure 19B:
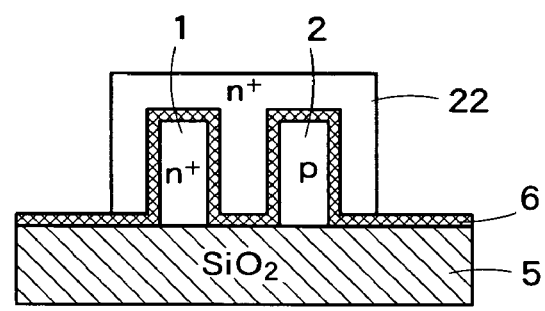
Figure 19C:
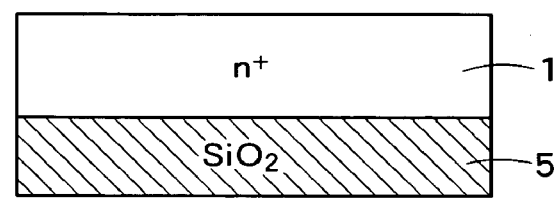
Figure 19D:
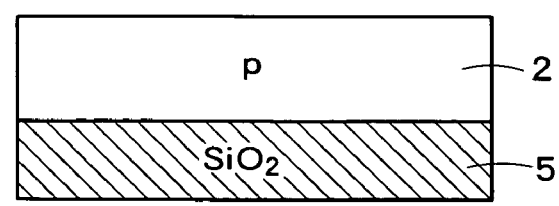
Figure 21A:
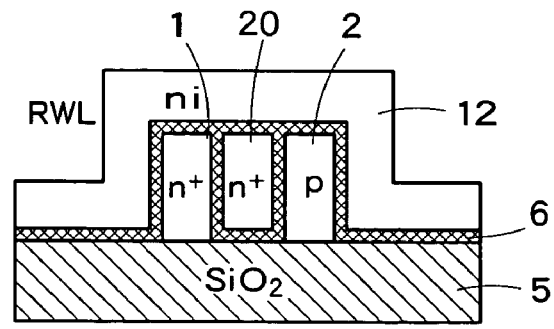
FIGS. 21A-21D are process charts subsequent to FIG. 20.
Figure 21B:
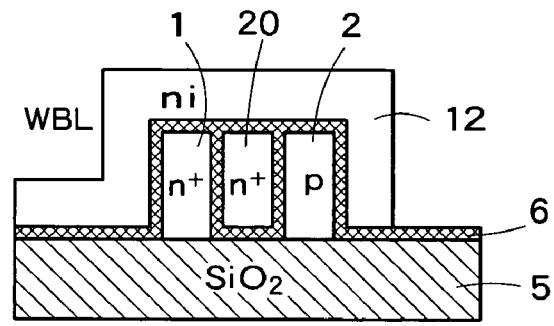
Figure 21C:
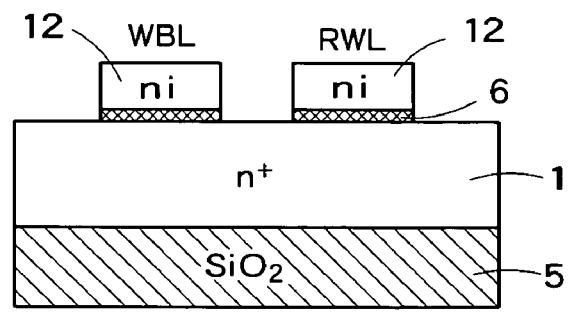
Figure 21D:
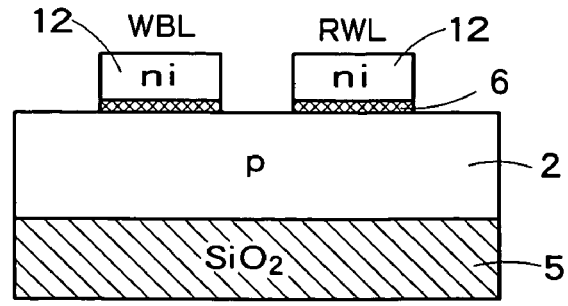
Figure 22A:
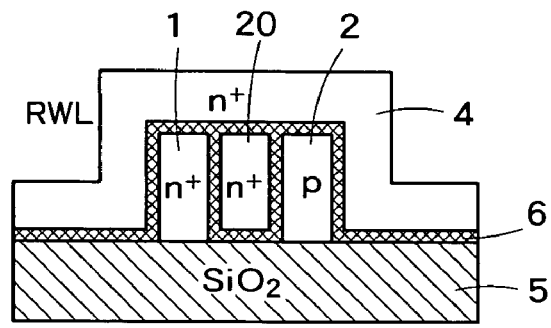
FIGS. 22A-22D are process charts subsequent to FIG. 21.
Figure 22B:
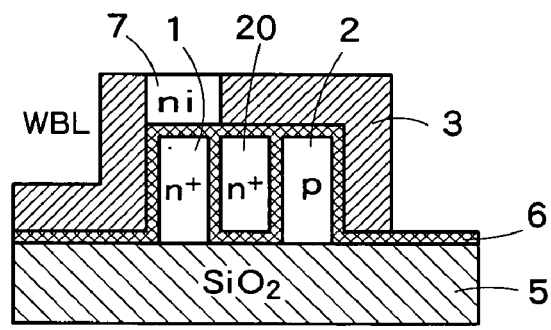
Figure 22C:
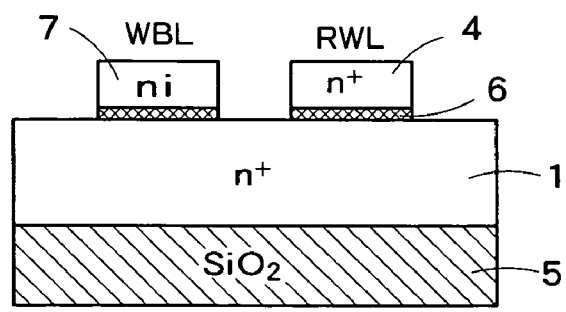
Figure 22D:
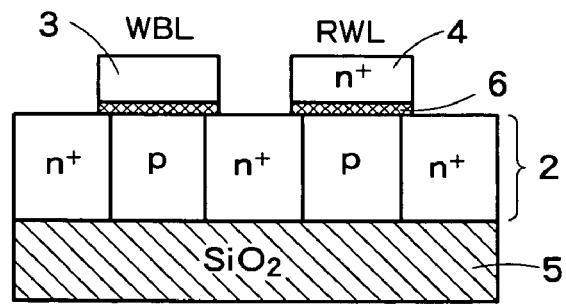

FIG. 4A is a cross-sectional view along the line C-C' in FIG. 2, and FIG. 4B is a cross-sectional view along the line D-D' in FIG. 2.

As shown in FIG. 4A, the first semiconductor layer 1 has an $n^+$ layer formed on the $SiO_2$ layer 5. On the $n^+$ layer, the write transistor forming region 3 and the read-out transistor gate region 4 are arranged so as to be separated from each other in the substrate surface direction. The write transistor forming region 3 shown in the cross-sectional view along the line C-C' has an intrinsic semiconductor region formed via the insulating layer 6, and the read-out transistor gate region 4 has a $n^+$ region formed via the insulating layer 6.

As shown in FIG. 4B, the second semiconductor layer 2 has a plurality of diffusion layer regions, more specifically $n^+$ region, p region, $n^+$ region, p region, and $n^+$ region, which are tightly arranged in the substrate surface direction on the $SiO_2$ layer 5. On these diffusion layer regions, the write transistor gate region 3 and the read-out transistor gate region 4 are formed. In the cross-sectional view along the line D-D', the write transistor forming region 3 has a $p^+$ region formed via the insulating layer 6, and the read-out transistor gate region 4 has a $n^+$ region formed via the insulating layer 6.

FIG. 5 is an entire layout diagram of the semiconductor storage device according to the first embodiment. As shown in FIG. 5, in the direction parallel to the direction of X, there are alternately arranged the write transistor forming region 3 connected to the write bit line WBL, the read-out transistor gate region 4 connected to the read-out word line RWL, the reference potential line 15 connected to the reference potential (ground potential), and the current sense region 16 connected to the sense amplifier 8. Further, in direction parallel to the direction of Y, there are alternately arranged the first semiconductor layer 1 whose one end is connected to the write word line WWL and whose other end is connected to the transistor Q4, and the second semiconductor layer 2 whose one end is connected to the read-out bit line RBL.

The layout diagram in FIG. 2 shows an enlarged view for one cell indicated by a dotted line part 17 in FIG. 5, and a region 18 surrounded with a circle in FIG. 5 corresponds to the electric charge storage node.

FIG. 6 is a timing chart of an operation of the semiconductor storage device according to the first embodiment. FIG. 6 shows an example in which writing and reading operations are alternately performed. The period from the time t1 to the time t2 in FIG. 6 is a writing period, during which the transistor Q1 is turned on and "1" is written in the electric charge storage node S. The period from the time t3 to the time t4 is a reading-out period, during which the transistor Q2 is turned on and a current corresponding to the potential of the electric charge storage node S flows through the transistor Q2. In this case, since the potential of electric charge storage node S is "1", the current flowing between the drain and source of the transistor Q3 is increased, so that the drain of the transistor Q3 is set to "0". Thus, the read-out bit line connected to the source of the transistor Q2 is set to "0". In this way, data are read out by using a logic level inverse to the logic level of the written data.

The period from the time t5 to the time t6 is a writing period, during which the transistor Q1 is turned on and "0" is written in the electric charge storage node S. The period from the time t7 to the time t8 is a reading-out period, during which the transistor Q2 is turned on and a current corresponding to the potential of the electric charge storage node S flows through the transistor Q3. In this case, since the potential of electric charge storage node S is "0", almost no current flows between the drain and the source of the transistor Q3, so that the read-out bit line RBL connected to the transistor Q2 is set to "1".

In FIG. 6, during the periods from the time t2 to the time t5 and from the time t6 to the time t8, the potential of the write word line WWL and of the first semiconductor layer 1 is unfixed.

FIG. 7 is a process chart showing a manufacturing process of the semiconductor storage device according to the present embodiment. In the following, the manufacturing process will be described in order on the basis of these figures. First, after a silicon layer is deposited on the $SiO_2$ layer 5, regions 10, 11 for forming the first and second semiconductor layers 1, 2 are made by patterning the silicon layer by Reactive Ion Etching (RIE) (FIG. 7A to FIG. 7D). Next, impurity ions different from each other are respectively implanted into the regions for forming the first and second semiconductor layers 1, 2, so that the first and second semiconductor layers 1, 2 are formed (FIG. 8A to FIG. 8D).

Next, after the insulating layer 6 is formed on the whole surface of the substrate, the insulating layers 6 other than the circumference of the first and second semiconductor layers 1, 2 is removed by RIE. Next, an intrinsic semiconductor layer 12 is formed on the whole surface of the substrate (FIG. 9A to FIG. 9D). Next, impurity ions are implanted into the intrinsic semiconductor layer 12 of a region for forming the read-out transistor gate to make the intrinsic semiconductor layer into the $n^+$ region, so that the read-out transistor gate region 4 is formed. Further, impurity ions (for example, boron) are implanted into the intrinsic semiconductor layer 12 of a region for forming the write transistor forming region 3 other than the channel region of the intrinsic semiconductor layer, so that the $p^+$ region is formed. As a result, the write transistor forming region 3 is formed (FIG. 10A to FIG. 10D).

As described above, in the first embodiment, the write transistor forming region 3 is arranged above the first semiconductor layer 1 serving as the gate of the transistor Q1. In addition, the source, the channel and the drain of the transistor Q1 and the gate of the transistor Q2 are formed in the write transistor forming region 3. Therefore, the cell structure can be made into a compact form. Consequently, it is possible to reduce the whole circuit area of the semiconductor storage device, and to comply with an increase in its storage capacity.

Second Embodiment

Second embodiment uses a Schottky transistor as the write control transistor Q1.

FIG. 11 is a layout diagram for one cell of a semiconductor storage device of the second embodiment according to the present invention. In FIG. 11, components common to those in FIG. 1 are denoted by the same reference characters, and in the following, the difference from FIG. 1 will be mainly described. The semiconductor storage device shown in FIG. 11 has a same structure as that of the first embodiment except in that the material of the write transistor forming region 3 is different from that of the first embodiment. The write transistor forming region 3a in FIG. 11 is formed by using a metal or a silicide.

FIG. 12A is a cross-sectional view along the line A-A' in FIG. 11, and FIG. 12B is a cross-sectional view along the line B-B' in FIG. 11. Further, FIG. 13A is a cross-sectional view along the line C-C' in FIG. 11, and FIG. 13B is a cross-sectional view along the line D-D' in FIG. 11. The structure in FIG. 12A is the same as that in FIG. 3A, and the structure in FIG. 13A is also the same as that in FIG. 4A.

As shown in FIG. 12B, the write transistor forming region 3a is formed by a metal or a silicide except for the channel region 7 formed above the first semiconductor layer 1. Thereby, the source and the drain of the transistor Q1 are formed by the metal or the silicide, so that the transistor Q1 functions as a Schottky transistor.

The write transistor forming region 3a is also connected to the gate of the transistor Q2, and as shown in FIG. 13B, the gate of the transistor Q3 is also formed by the metal or the silicide.

As in the present embodiment, in the case where a part of the write transistor forming region 3a is formed by a metal or a silicide, impurity ions such as boron need not be implanted into the write transistor forming region 3a so as to form $p^+$ region and the like. Therefore, the manufacturing process can be simplified, compared with the first embodiment. In the case where impurity ions are implanted as in the first embodiment, process operations such as an operation to coat beforehand a resist for covering the channel region 7 are needed so as to prevent impurity ions from being mistakenly implanted into the channel region, and hence, the manufacturing process is made to be complicated. However, in the present embodiment, the ion plantation is not needed, so that it is possible to simplify the manufacturing process and to improve the yield.

Further, in the case of the present embodiment, the write transistor Q1 is formed by a Schottky transistor, so that an effect of increasing the write speed is also obtained.

In the case where the semiconductor storage device according to the present embodiment is manufactured, after the manufacturing processes similar to those shown in FIG. 7 to FIG. 11, a metal portion is formed by vapor-depositing and the like in a region other than the channel region 7 in the write transistor forming region 3a, as shown in FIG. 14, and thereafter the portion is subjected to a heat treatment so as to be silicificated. Thereby, a silicide is formed in the write transistor forming region 3a as shown in FIG. 12.

As described above, in the second embodiment, a metal or silicide portion is formed in the region other than the channel region 7 in the write transistor forming region 3a, so that a manufacturing process can be simplified more than the process as in the first embodiment in which impurity ions are implanted. Further, the write control transistor Q1 is formed by the Schottky transistor, so that the write speed can be increased.

Third Embodiment

The third embodiment is arranged so as to enable the rewrite operation to be performed simultaneously with the read-out operation.

FIG. 15 is a layout diagram of a semiconductor storage device of the third embodiment according to the present invention. Unlike FIG. 1, a capacitive coupling layer 20 is arranged between the first and second semiconductor layers 1, 2. The capacitive coupling layer 20 is formed by a conductive material (for example, poly-silicon) or a high dielectric material. The first and second semiconductor layers 1, 2 are capacitively coupled with each other by the capacitive coupling layer 20 so as to have a substantially same potential.

For example, in the case where the read-out word line RBL connected to the second semiconductor layer 2 is set to "0" when data are read out, the potential of the first semiconductor layer 1 is also set to substantially "0" due to the capacitive coupling. Thus, the write control transistor Q1 is turned on and the rewrite of read-out data is performed.

FIG. 16A is a cross-sectional view along the line A-A' in FIG. 15, and FIG. 16B is a cross-sectional view along the line B-B' in FIG. 15. As shown in these figures, the capacitive coupling layer 20 is formed between the first and second semiconductor layers 1, 2 so as to make the insulating layer 6 sandwiched between the first and second semiconductor layers.

Since a cross-sectional view along the line C-C' in FIG. 15 is the same as that in FIG. 4A, and a cross-sectional view along the line D-D' in FIG. 15 is the same as that in FIG. 4B, the description of these cross-sectional views is omitted.

FIG. 17 is an entire layout diagram showing the semiconductor storage device according to the third embodiment. FIG. 17 is different from FIG. 5 in that read-out data lines 16 are provided in substantially parallel to the write transistor forming region 3, that an inverter 21 is provided for a subsequent stage of the sense amplifier 8, and that the output of the inverter 21 is supplied to the write transistor forming region 3.

The reason for supplying the output of the inverter 21 to the write transistor forming region 3 is to perform the operation of rewriting read-out data into the electric charge storage region substantially simultaneously with the operation of reading out the data.

In the case of the present embodiment, the first and second semiconductor layers 1, 2 are capacitively coupled by the capacitive coupling layer 20. Thus, when data are read out, the potential of the first semiconductor layer 1 becomes substantially equal to the potential which is supplied from the second semiconductor layer 2 to the RBL line. Further, when the sense amplifier 8 outputs a signal corresponding to the read-out data simultaneously with the reading-out operation, the inverted signal of the outputted signal is supplied to the write transistor forming region 3 from the inverter 21. Accordingly, in the case where data "0" is read out, the transistor Q1 is turned on, so that the output of the inverter 21 is written into the electric charge storage region in the write transistor forming region 3.

FIG. 18 is a timing chart of an operation of the semiconductor storage device according to the third embodiment. The operation at the time of writing is the same as that shown in FIG. 6, and hence, the explanation thereof is omitted. When data are read out (during the period from the time t3 to the time t4), data corresponding to electric charges stored in the electric charge storage node via the transistors Q2, Q3 are read out to the read bit line RBL via the second semiconductor layer 2. At this time, the read bit line RBL is set to "0", so that the first semiconductor layer 1 is also set to the potential of "0" due to capacitive coupling. Further, the sense amplifier 8 outputs "0" at this time, so that the inverter 21 supplies "1" as the inverted data of the output to the write transistor forming region 3. The gate of the transistor Q1 is set to "0", so that the transistor Q1 is turned on and data "1" is rewritten.

On the other hand, the write word line WWL is made to be in an unstable state during the periods from the time t2 to the time t3, from the time t4 to the time t5, and from the time t6 to the time t7.

As can be seen from FIG. 18 in comparison with FIG. 6, according to the present embodiment, when data are read out, the potential of the write word line WWL and the first semiconductor layer 1 becomes a value corresponding to the potential of the read bit line RBL, and does not become unstable.

In the manufacturing process of the semiconductor storage device according to the present embodiment, after the processes shown in FIG. 8A to FIG. 8D, the insulating layer 6 is formed on the whole surface of the substrate, and an $n^+$ type poly-silicon layer is formed on the insulating layer 6. Next, the poly-silicon layer 22 is subjected to a patterning processing using RIE, so as to be formed only around the circumference of the first and second semiconductor layers 1, 2 (FIG. 19A to FIG. 19D).

Next, after the top surface side of the poly-silicon layer 22 is removed by etching, the insulating layer 6 is formed, so that the capacitive coupling layer 20 made of the poly-silicon is formed (FIG. 20A to FIG. 20D). Next, after the intrinsic semiconductor layer 12 is formed on the whole surface of the substrate (FIG. 21A to FIG. 21D), impurity ions are implanted into the intrinsic semiconductor layer of the read-out transistor gate region 4, so that this region is made into the $n^+$ region 4 (FIG. 22A to FIG. 22D).

As described above, in the third embodiment, the capacitive coupling layer 20 is formed between the first and second semiconductor layers 1, 2, so as to make the first and second semiconductor layers 1, 2 capacitively coupled, and in addition, the output data of the sense amplifier 8 are supplied to the write transistor forming region 3. As a result, the write-back of read-out data can be performed by making the transistor Q1 turned on in accordance with the read-out data, and the refresh operation can be performed simultaneously with the read-out operation. Consequently, data can be held without providing a refresh circuit in particular, and the circuit areas of the whole semiconductor storage device can be reduced.

Other Embodiments

Figure 23:
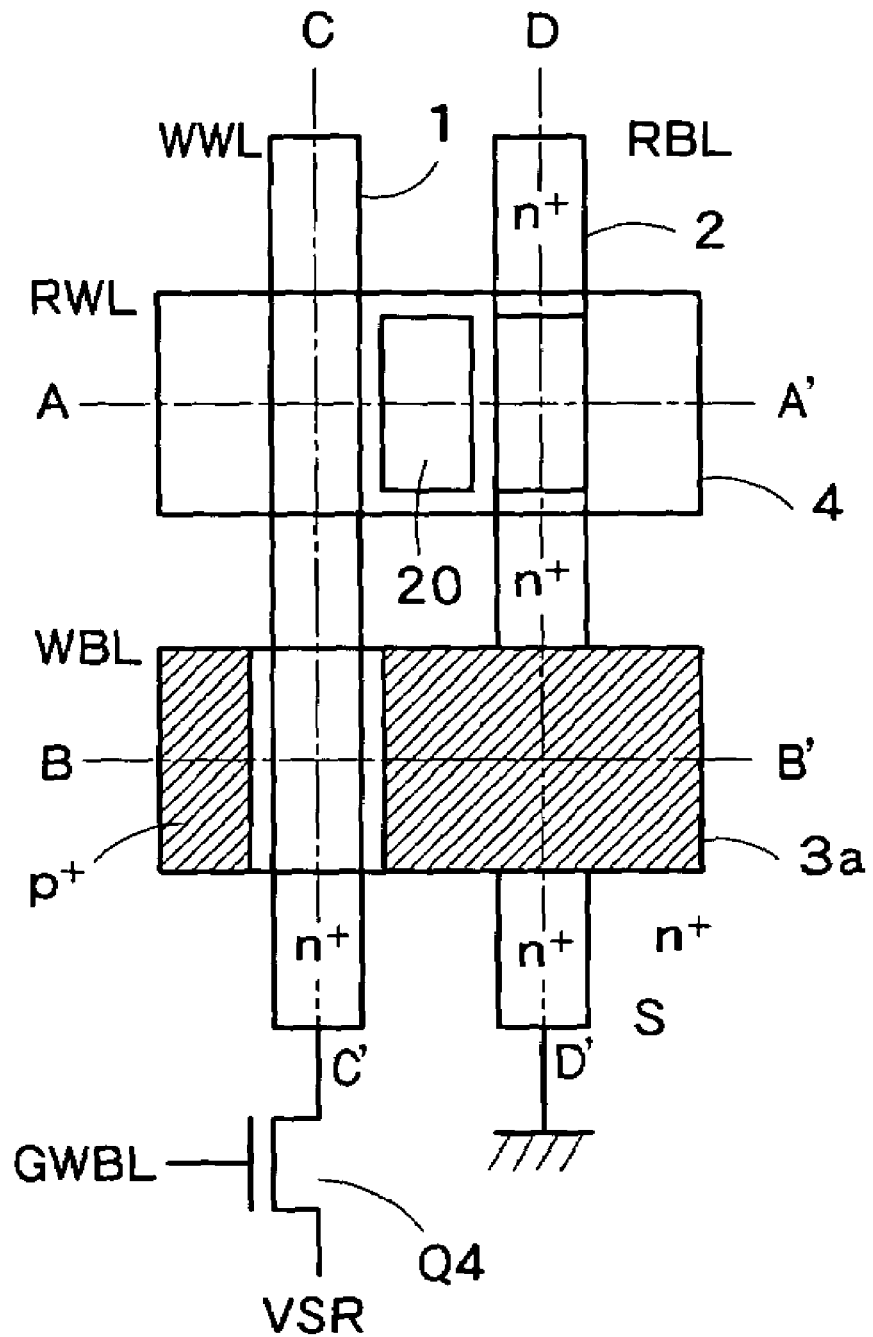
FIG. 23 is a layout diagram showing a modified example of second and third embodiments.

The above described second and third embodiments may be combined so as to make the transistor Q1 into a Schottky transistor and to provide a capacitive coupling layer 20. FIG. 23 shows a layout diagram in this case. In the case of FIG. 23, there are both advantageous effects of the second and third embodiments in which it is possible to simplify manufacturing processes, improve writing speed, and simultaneously conduct read-out and writing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device, comprising:
   a first transistor of first conductive type which control data writing;
   a second transistor of second conductive type which controls data read-out;
   a third transistor which amplifies a current corresponding to data to be read out;
   a first semiconductor layer which is disposed in a predetermined direction, in which a gate of the first transistor is formed;
   a second semiconductor layer which is disposed separately from the first semiconductor layer in the predetermined direction, in which source and drain of the second transistor and source and drain of the third transistor are formed;

a write transistor forming region which is disposed in a direction intersecting the first and second semiconductor layers, in which source and drain of the first transistor, a gate of the third transistor and an electric charge storing region storing electric charge in accordance with data to be written are formed; and a read-out transistor gate region which is disposed in a direction intersecting the first and second semiconductor layers, in which a gate of the second transistor is formed.

2. The semiconductor storage device according to claim 1, wherein at least a portion of the write transistor forming region is formed above the first semiconductor layer; and at least a portion of the read-out transistor gate region is formed above the second semiconductor layer, the write transistor forming region having:

a channel region disposed via an insulating film above the first semiconductor layer; and a source region and a drain region formed at both sides of the channel region.

3. The semiconductor storage device according to claim 2, wherein the source region and the drain region in the write transistor forming region are diffusion regions of first conductive type.

4. The semiconductor storage device according to claim 3, wherein the channel region is an intrinsic semiconductor region or a semiconductor region of second conductive type.

5. The semiconductor storage device according to claim 1, wherein the insulating film is formed to overlap surfaces of the first and second semiconductor layers;

at least a portion of the write transistor forming region is formed to overlap the insulating film; and at least a portion of the read-out transistor forming region is formed to overlap the insulating film.

6. The semiconductor storage device according to claim 1, further comprising:

a write word line connected to one end of the first semiconductor layer;

a read-out bit line connected to one end of the second semiconductor layer;

a write bit line connected to one end of the write transistor forming region; and a read-out word line connected to one end of the read-out transistor gate region.

7. The semiconductor storage device according to claim 6, wherein when data is written, the first transistor turns on, and data supplied from the write bit line is stored in the electric charge storing region via the first transistor.

8. The semiconductor storage device according to claim 6, wherein when data is read out, the second transistor turns on, and a current in accordance with data stored in the electric charge storing region flows through the third transistor to read out the data to the read-out bit line via the second transistor.

9. The semiconductor storage device according to claim 2, wherein the source region and the drain region in the write transistor forming region are formed of a material including a metal; and the transistor is a schottky transistor.

10. The semiconductor storage device according to claim 9, wherein the channel region is an intrinsic semiconductor region.

11. The semiconductor storage device according to claim 1, wherein the first transistor reads out data by using the second and third transistors, and simultaneously stores the read-out data into the electric charge storing region.

12. The semiconductor storage device according to claim 1, further comprising a capacitive coupling layer disposed between the first and second semiconductor layers to capacitively couple the first and second semiconductor layers.

13. The semiconductor storage device according to claim 12, wherein the capacitive coupling layer is a conductive layer or a high dielectric layer.

14. The semiconductor storage device according to claim 12, wherein the capacitive coupling layer is formed below the read-out transistor gate region.

15. The semiconductor storage device according to claim 11, further comprising:

a sense amplifier which senses data read out via the second transistor; and a buffer which feeds back an output of the sense amplifier to the write transistor forming region.

16. The semiconductor storage device according to claim 1, further comprising a fourth transistor which controls switching of whether to set one end of the first semiconductor layer to a reference potential.

17. The semiconductor storage device according to claim 1, wherein a plurality of the first semiconductor regions and a plurality of the second semiconductor regions are alternatively formed in a first direction; and a plurality of the write transistor forming regions and a plurality of the read-out transistor gate regions are alternatively formed in a second direction different from the first direction.

18. The semiconductor storage device according to claim 1, wherein the second semiconductor layer has semiconductor regions of alternatively different conductive types, the semiconductor regions being used as gate, source and drain of the second and third transistors.

* * * * *